(12) United States Patent
Bathan et al.

(10) Patent No.: US 7,691,674 B1
(45) Date of Patent: Apr. 6, 2010

(54) INTEGRATED CIRCUIT PACKAGING SYSTEM WITH STACKED DEVICE AND METHOD OF MANUFACTURING THEREOF

(75) Inventors: Henry Descalzo Bathan, Singapore (SG); Zigmund Ramirez Camacho, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/488,557

(22) Filed: Jun. 20, 2009

(51) Int. Cl.
*H01L 21/44* (2006.01)
*H01L 23/02* (2006.01)

(52) U.S. Cl. .................. 438/109; 438/112; 438/122; 438/123; 257/676; 257/686; 257/778

(58) Field of Classification Search ......... 438/107–112, 438/121–127; 257/666, 676, 685, 686, 692, 257/693, 773, 777, 778
See application file for complete search history.

(56) References Cited

U.S. PATENT DOCUMENTS

| 6,590,281 | B2 * | 7/2003 | Wu et al. ................ 257/684 |
| 6,841,870 | B2 * | 1/2005 | Misumi ................ 257/723 |
| 6,921,968 | B2 | 7/2005 | Chung |
| 7,154,186 | B2 * | 12/2006 | Noquil et al. ............ 257/778 |
| 2003/0001252 | A1 * | 1/2003 | Ku et al. .................. 257/686 |
| 2004/0021230 | A1 | 2/2004 | Tsai et al. |
| 2006/0197207 | A1 * | 9/2006 | Chow et al. ............ 257/686 |
| 2008/0029868 | A1 | 2/2008 | Lee et al. |
| 2008/0111222 | A1 | 5/2008 | Sheridan et al. |
| 2008/0203549 | A1 | 8/2008 | Chow et al. |
| 2008/0308933 | A1 * | 12/2008 | Tay et al. ................ 257/738 |
| 2008/0315380 | A1 * | 12/2008 | Tay et al. ................ 257/676 |

* cited by examiner

*Primary Examiner*—Kevin M Picardat
(74) *Attorney, Agent, or Firm*—Mikio Ishimaru

(57) ABSTRACT

A method of manufacture of an integrated circuit packaging system includes: forming a first lead, having a first body and a first tip, and a paddle, having a protrusion at a side of the paddle, with the first body adjacent to the protrusion; forming a second lead having a second body and a second tip adjacent to the paddle; attaching a device, having a device active side, to the paddle and adjacent to the protrusion; mounting a component, having a component active side, to the device with the component active side facing the device active side and between the second body and the first tip; connecting the component and the second body; and forming an encapsulation covering the device, and partially covering the paddle, the component, the first lead, and the second lead.

20 Claims, 3 Drawing Sheets

INTEGRATED CIRCUIT PACKAGING SYSTEM WITH STACKED DEVICE AND METHOD OF MANUFACTURING THEREOF

TECHNICAL FIELD

The present invention relates generally to an integrated circuit packaging system, and more particularly to a system for an integrated circuit packaging system with stacked device.

BACKGROUND ART

Semiconductor package structures continue to become thinner and ever more miniaturized. This results in increased component density in semiconductor packages and decreased sizes of the IC products in which the packages are used. These developmental trends are in response to continually increasing demands on electronic apparatus designers and manufacturers for ever-reduced sizes, thicknesses, and costs, along with continuously improving performance.

These increasing demands for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

As the integrated circuit technology advances, more circuit cells can be fabricated in a similar die area so that substantially increased functionality can be accomplished on a given integrated circuit die. The added functionality and increase in the number of circuits generally involves a larger amount of power dissipation. The heat is transmitted from one integrated circuit to the other and there is no significant dissipation path other than through the solder ball to the motherboard. The increased heat in the package can significantly reduce the life of the integrated circuits in the package.

Thus, a need still remains for an integrated circuit packaging system providing integration and thermal efficiency. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a first lead, having a first body and a first tip, and a paddle, having a protrusion at a side of the paddle, with the first body adjacent to the protrusion; forming a second lead having a second body and a second tip adjacent to the paddle; attaching a device, having a device active side, to the paddle and adjacent to the protrusion; mounting a component, having a component active side, to the device with the component active side facing the device active side and between the second body and the first tip; connecting the component and the second body; and forming an encapsulation covering the device, and partially covering the paddle, the component, the first lead, and the second lead.

The present invention provides an integrated circuit packaging system, including: a first lead having a first body and a first tip; a paddle, having a protrusion at a side of the paddle, with the first body adjacent to the protrusion; a second lead having a second body and a second tip adjacent to the paddle; a device, having a device active side, to the paddle and adjacent to the protrusion; a component, having a component active side, mounted to the device with the component active side facing the device active side, between the second body and the first tip, and connected to the second body; and an encapsulation covering the device, and partially covering the paddle, the component, the first lead, and the second lead.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
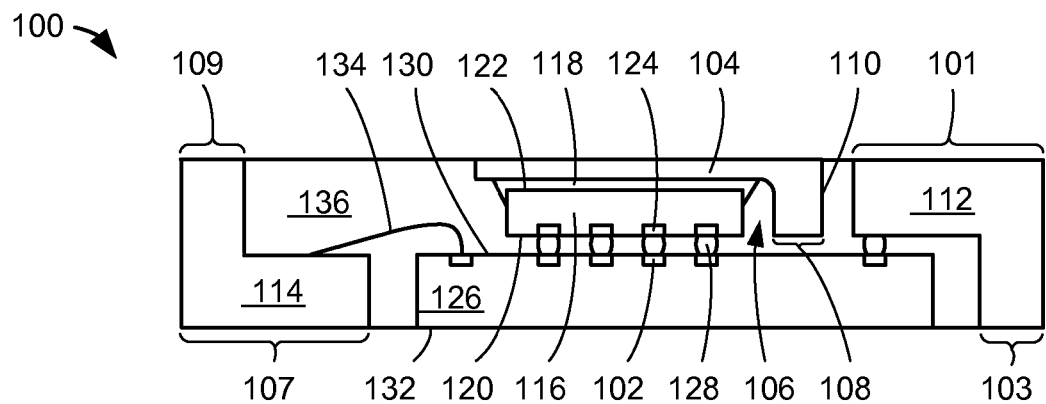
FIG. 1 is a cross-sectional view of an integrated circuit packaging system with stacked device along a section line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 2:
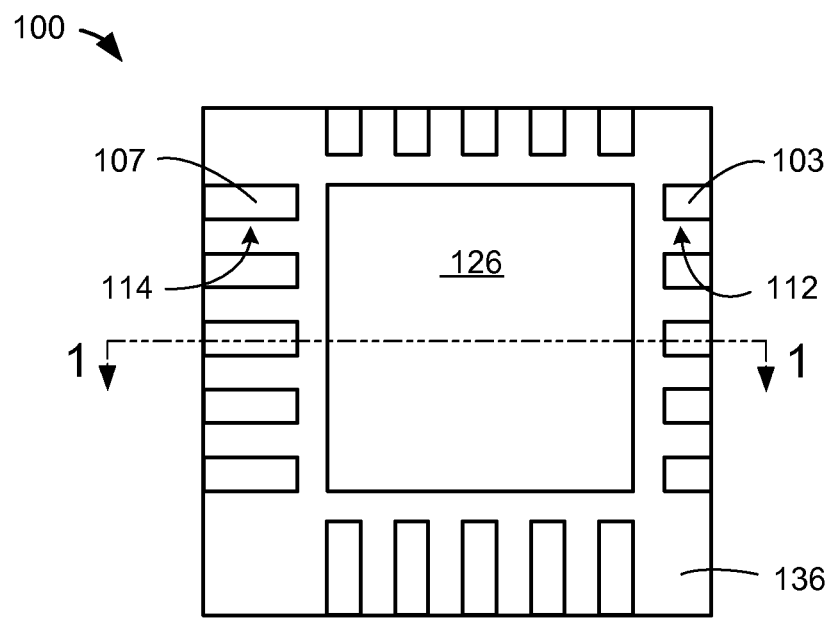
FIG. 2 is a bottom view of the integrated circuit packaging system of FIG. 1.

Referring now to FIG. 1, therein is shown a cross-sectional view of an integrated circuit packaging system 100 with stacked device along a section line 1-1 of FIG. 2 in an embodiment of the present invention. The cross-sectional view depicts a paddle 104, such as a die-attach paddle, a die-attach pad, or a carrier. The paddle 104 can serve as a ground site, a heat spreader, an electromagnetic interference (EMI) shield, a structure providing a planar rigidity for mitigating warpage, or a combination thereof.

The paddle 104 can include a recess 106. The recess 106 can be preferably formed by etching or any other means for providing the recess 106. The paddle 104 can be formed in an asymmetrical configuration, which can include a protrusion 108 at a side 110 of the paddle 104.

The cross-sectional view also depicts a first lead 112 and a second lead 114 at the periphery of the integrated circuit packaging system 100. The first lead 112 can include a first body 101 and a first tip 103. The second lead 114 can include a second body 107 and a second tip 109 adjacent to the paddle 104.

The first lead 112 can be formed in a shape of an "L" with the first body 101 and the first tip 103 representing a horizontal portion and a vertical portion of the "L" shape, respectively. The paddle 104, the first lead 112 and the second lead 114 can preferably be formed of a common material having characteristics being formed from a single integral structure.

The first lead 112 is shown with the first body 101 adjacent to the protrusion 108 and the second lead 114 is shown at an opposing side of the integrated circuit packaging system 100. The paddle 104 can be formed with the protrusion 108 facing the first body 101 and facing away from the second tip 109.

The paddle 104 can be between the first body 101 of the first lead 112 and the second tip 109 of the second lead 114. The second lead 114 can be identical or similar to the first lead 112.

The integrated circuit packaging system 100 can include a device 116, such as an integrated circuit die, a flip chip, or a wafer level chip scale package (WLCSP), attached to the paddle 104 with an adhesive 118, such as a die-attach adhesive or a thermal adhesive.

The device 116 can include a device active side 120 and a device inactive side 122 at an opposing side of the device active side 120. The device active side 120 can include active circuitry (not shown) fabricated thereon. The device 116 can be attached to the paddle 104 with the device inactive side 122 facing the paddle 104. The device 116 can include a device bond pad 124 at the device active side 120.

It has been discovered that the present invention provides the integrated circuit packaging system 100 having improved integration. The paddle 104 having the asymmetrical shape with the protrusion 108 can provide more space for the device 116 having a larger horizontal dimension extending horizontally beyond the paddle 104 and away from the protrusion 108 thereby maximizing space utilization.

The integrated circuit packaging system 100 can also include a component 126, such as a flip chip, a wafer level chip scale package (WLCSP), or an integrated circuit die, attached to the device 116 with a first internal interconnect 128, such as a solder bump or a conductive post.

The component 126 can include a component active side 130 and a component inactive side 132 at an opposing side of the component active side 130. The component active side 130 can include active circuitry (not shown) fabricated thereon. The component 126 can be attached to the device 116 with the component active side 130 facing the device active side 120 and between the second body 107 and the first tip 103.

The component 126 can include a component bond pad 102 at the component active side 130. The first internal interconnect 128 can be attached to the device bond pad 124 and the component bond pad 102. The first internal interconnect 128 can also attach the component bond pad 102 and the first body 101 of the first lead 112.

A second internal interconnect 134, such as a bond wire, a ribbon bond wire, or a conductive wire, can connect the component bond pad 102 of the component 126 and the second body 107 of the second lead 114. For illustrative purposes, the integrated circuit packaging system 100 is shown with the second internal interconnect 134 connected to the second lead 114, although it is understood that the integrated circuit packaging system 100 can have a different configuration. For example, the second internal interconnect 134 can connect the first lead 112 and the component 126.

It has also been discovered that the present invention provides the integrated circuit packaging system 100 having decreased form factor. The device 116 and the component 126 can be interconnected in a face-to-face configuration. The face-to-face configuration and utilization of the same interconnect structure, such as solder bumps, with matching input/output locations enables a reduction in package size.

It has been further discovered that the present invention provides the integrated circuit packaging system 100 with high density of input/outputs. The horizontal and vertical transpose between the first lead 112 and the second lead 114 allows the device 116 or the component 126 to connect not only to each other but also to both the first lead 112 and the second lead 114.

The integrated circuit packaging system 100 can include an encapsulation 136, such as a cover including an epoxy molding compound. The encapsulation 136 can cover the device 116. The encapsulation 136 can partially cover the paddle 104 with the protrusion 108 covered, the first lead 112, the second lead 114, and the component 126.

The encapsulation 136 can partially expose the paddle 104, the first lead 112, the second lead 114, and the component inactive side 132. The paddle 104, the first body 101 and the first tip 103 of the first lead 112, the second body 107 and the second tip 109 of the second lead 114, and the component inactive side 132 of the component 126 can be coplanar with the encapsulation 136.

It has been found that the present invention provides the integrated circuit packaging system 100 having thermal efficiency. The paddle 104 can serve as a heat spreader for conducting heat away from the device 116 to ambient. The component inactive side 132 exposed from the encapsulation 136 also provides a thermal conduction path to ambient.

It has also been found that the present invention provides the integrated circuit packaging system 100 having further improved integration. The integrated circuit packaging system 100 can provide a stackable structure such that multiple of the integrated circuit packaging system 100 can be mounted over one another. The integrated circuit packaging system 100 can include the first lead 112 and the second lead 114 partially exposed at the top and the bottom of the integrated circuit packaging system 100, providing more input/output interconnection to external systems, which can include components, packages, printed circuit board (PCB), or a combination thereof. The paddle 104 can also function as an EMI shield to improve performance of the integrated circuit packaging system 100 in a stacked configuration.

Referring now to FIG. 2, therein is shown a bottom view of the integrated circuit packaging system 100 of FIG. 1. The bottom view depicts the component 126 partially exposed from the encapsulation 136. The component 126 can be mounted between the second body 107 and the first tip 103.

The bottom view depicts the first lead 112 and the second lead 114, partially exposed from the encapsulation 136. The first lead 112 can include the first tip 103. The second lead 114 can include the second body 107. The bottom view depicts the first lead 112 is shown smaller relative to the second lead 114.

Figure 3:
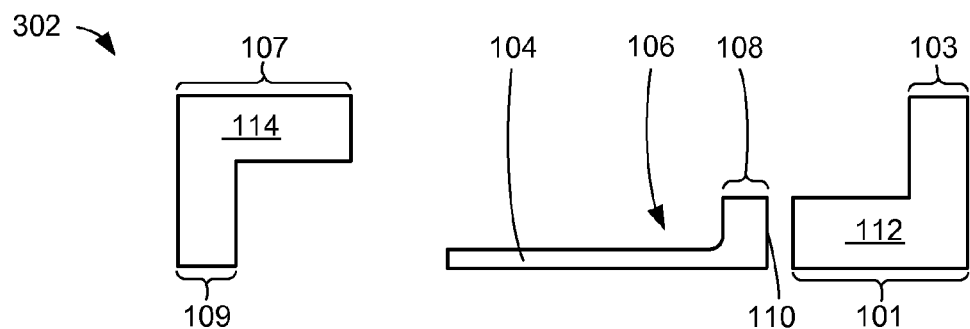
FIG. 3 is a cross-sectional view of the integrated circuit packaging system in an assembly process of a formation phase of a portion of a leadframe.

Referring now to FIG. 3, therein is shown a cross-sectional view of the integrated circuit packaging system 100 in an assembly process of a formation phase of a portion of a leadframe 302. The leadframe 302 is shown without dam bars and tie bars for clarity.

The leadframe 302 can include the paddle 104. The paddle 104 can be preferably formed by etching or any other means for providing the recess 106. The paddle 104 can be formed in an asymmetrical configuration, which can include the protrusion 108 at the side 110 of the paddle 104. The protrusion 108 can serve as a stiffener for providing functions, which can include mitigating warpage.

The cross-sectional view depicts the leadframe 302 having the first lead 112. The first lead 112 can be formed in a shape of an "L" with the first body 101 and the first tip 103 representing a horizontal portion and a vertical portion of the "L" shape, respectively. A lower portion of the first lead 112 can be coplanar with the top of the protrusion 108. The first lead 112 can include the first body 101 and the first tip 103.

The cross-sectional view depicts the leadframe 302 having the first body 101 of the first lead 112 adjacent to the protrusion 108 and the second lead 114 at an opposite side to the side 110 of the paddle 104 having the protrusion 108. The protrusion 108 can be formed facing the first body 101 and facing away from the second tip 109.

The second lead 114 can be identical or similar to the first lead 112. The second lead 114 can include the second body 107 and the second tip 109 adjacent to the paddle 104. The paddle 104 can be between the first body 101 and the second tip 109.

Figure 4:
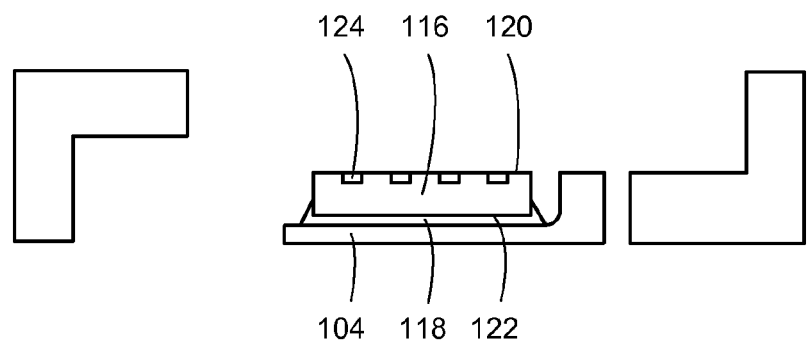
FIG. 4 is the structure of FIG. 3 in an attachment phase of the device.

Referring now to FIG. 4, therein is shown the structure of FIG. 3 in an attachment phase of the device 116. The device 116 can be attached to the paddle 104 with the adhesive 118. The device inactive side 122 is shown facing the paddle 104.

The device 116 can include the device bond pad 124 and the device active side 120 is shown facing away from the paddle 104.

Figure 5:
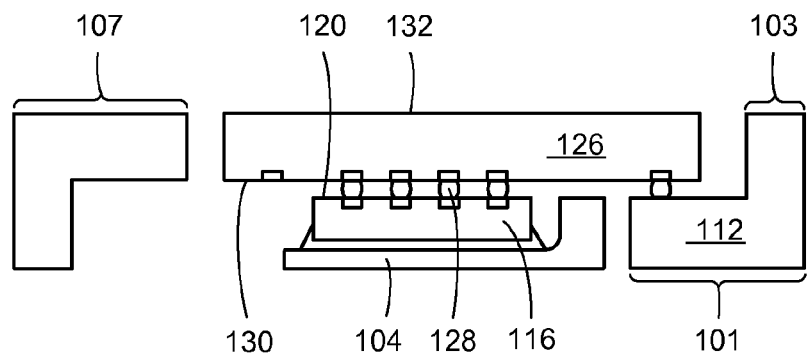
FIG. 5 is the structure of FIG. 4 in an attachment phase of the component.

Referring now to FIG. 5, therein is shown the structure of FIG. 4 in an attachment phase of the component 126. The component 126 can be mounted over the device 116 and the first body 101 of the first lead 112, the component 126 between the second body 107 and the first tip 103. The component 126 can extend beyond the horizontal dimensions of the device 116 and the paddle 104. The first internal interconnect 128 can attach the device 116 and the component 126. The first internal interconnect 128 can also attach the component 126 and the first body 101 of the first lead 112.

The component 126 can include the component active side 130 and the component inactive side 132 at an opposing side of the component active side 130. The first internal interconnect 128 can also attach the component 126 and the first lead 112. The component active side 130 is shown facing the device active side 120.

Figure 6:
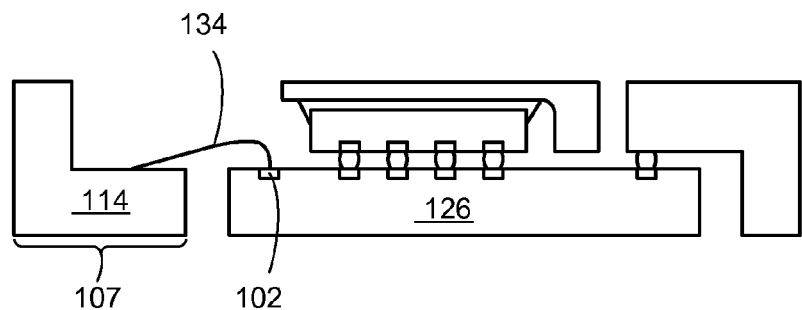
FIG. 6 is the structure of FIG. 5 in a connection phase of the second internal interconnect.

Referring now to FIG. 6, therein is the structure of FIG. 5 in a connection phase of the second internal interconnect 134. The cross-sectional view depicts the structure of FIG. 5 inverted in a vertical direction. The second internal interconnect 134 can connect the component bond pad 102 of the component bond pad 102 and the second body 107 of the second lead 114.

Figure 7:
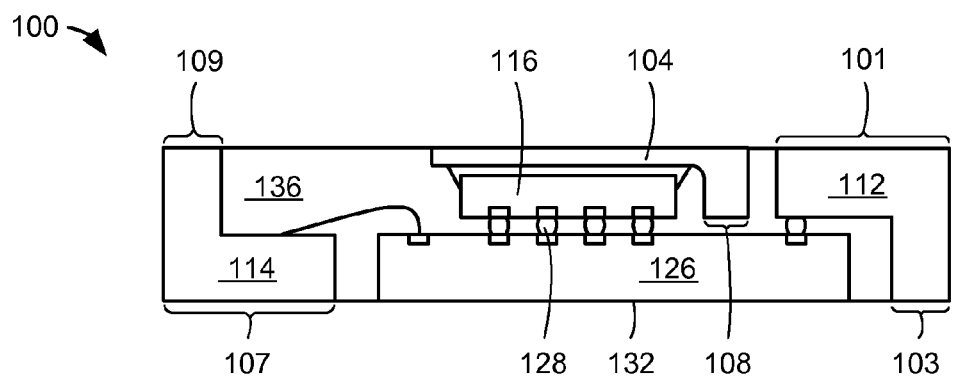
FIG. 7 is the structure of FIG. 6 in a formation phase of the encapsulation.

Referring now to FIG. 7, therein is shown the structure of FIG. 6 in a formation phase of the encapsulation 136. The encapsulation 136 can cover the device 116 and the first internal interconnect 128 and partially covering the paddle 104 with the protrusion 108 covered, the first lead 112, the second lead 114, and the component 126.

The encapsulation 136 can partially expose the paddle 104, the first lead 112, the second lead 114, and the component inactive side 132. The paddle 104, the first body 101 and the first tip 103 of the first lead 112, the second body 107 and the second tip 109 of the second lead 114, and the component inactive side 132 of the component 126 can be coplanar with the encapsulation 136. The leadframe 302 of FIG. 3 can be singulated forming the integrated circuit packaging system 100.

Figure 8:
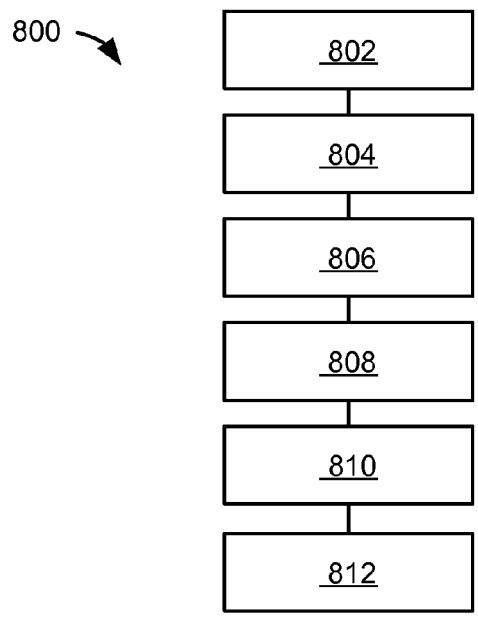
FIG. 8 is a flow chart of a method of manufacture of an integrated circuit packaging system in a further embodiment of the present invention.

Referring now to FIG. 8, therein is shown a flow chart of a method 800 of manufacture of an integrated circuit packaging system in a further embodiment of the present invention. The method 800 includes: forming a first lead, having a first body and a first tip, and a paddle, having a protrusion at a side of the paddle, with the first body adjacent to the protrusion in a block 802; forming a second lead having a second body and a second tip adjacent to the paddle in a block 804; attaching a device, having a device active side, to the paddle and adjacent to the protrusion in a block 806; mounting a component, having a component active side, to the device with the component active side facing the device active side and between the second body and the first tip in a block 808; connecting the component and the second body in a block 810; and forming an encapsulation covering the device, and partially covering the paddle, the component, the first lead, and the second lead in a block 812.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a first lead, having a first body and a first tip, and a paddle, having a protrusion at a side of the paddle, with the first body adjacent to the protrusion;
    forming a second lead having a second body and a second tip adjacent to the paddle;
    attaching a device, having a device active side, to the paddle and adjacent to the protrusion;
    mounting a component, having a component active side, to the device with the component active side facing the device active side and between the second body and the first tip;
    connecting the component and the second body; and
    forming an encapsulation covering the device, and partially covering the paddle, the component, the first lead, and the second lead.

2. The method as claimed in claim 1 wherein forming the first lead, having the first body and the first tip, and the paddle, having the protrusion at the side of the paddle, with the first body adjacent to the protrusion includes forming the protrusion facing the first body and facing away from the second tip.

3. The method as claimed in claim 1 wherein mounting the component includes mounting the component over the first body.

4. The method as claimed in claim 1 further comprising attaching a first internal interconnect between the device and the component.

5. The method as claimed in claim 1 wherein forming the first lead, having the first body and the first tip, and the paddle includes forming the paddle coplanar with the first body.

6. A method of manufacture of an integrated circuit packaging system comprising:
    forming a first lead, having a first body and a first tip, and a paddle, having a protrusion at a side of the paddle, with the first body adjacent to the protrusion;
    forming a second lead having a second body and a second tip adjacent to the paddle;
    attaching a device, having a device active side, to the paddle and adjacent to the protrusion;
    mounting a component, having a component active side, to the device and over the first body with the component active side facing the device active side and the component between the second body and the first tip;
    connecting the component and the second body; and
    forming an encapsulation covering the device, and partially covering the paddle with the protrusion covered, the component, the first lead, and the second lead.

7. The method as claimed in claim 6 wherein forming the encapsulation includes forming the encapsulation coplanar with the paddle, the first body, and the second tip.

8. The method as claimed in claim 6 wherein forming the encapsulation includes forming the encapsulation coplanar with the component, the first tip, and the second body.

9. The method as claimed in claim 6 wherein:
    mounting the component, having the component active side, to the device with the component active side facing the device active side includes attaching a first internal interconnect between the device and the component; and
    connecting the component and the second body includes attaching a second internal interconnect to the component and the second lead.

10. The method as claimed in claim 6 wherein mounting the component includes mounting a flip chip.

11. An integrated circuit packaging system comprising:
    a first lead having a first body and a first tip;
    a paddle, having a protrusion at a side of the paddle, with the first body adjacent to the protrusion;
    a second lead having a second body and a second tip adjacent to the paddle;
    a device, having a device active side, to the paddle and adjacent to the protrusion;
    a component, having a component active side, mounted to the device with the component active side facing the device active side, between the second body and the first tip, and connected to the second body; and
    an encapsulation covering the device, and partially covering the paddle, the component, the first lead, and the second lead.

12. The system as claimed in claim 11 wherein the paddle includes the protrusion facing the first body and facing away from the second tip.

13. The system as claimed in claim 11 wherein the component is over the first body.

14. The system as claimed in claim 11 further comprising a first internal interconnect between the device and the component.

15. The system as claimed in claim 11 wherein the paddle is coplanar with the first body.

16. The system as claimed in claim 11 wherein:
    the component is over the first body; and
    the encapsulation covers the protrusion.

17. The system as claimed in claim 16 wherein the encapsulation is coplanar with the paddle, the first body, and the second tip.

18. The system as claimed in claim 16 wherein the encapsulation is coplanar with the component, the first tip, and the second body.

19. The system as claimed in claim 16 further comprising:
    a first internal interconnect between the device and the component; and
    a second internal interconnect to the component and the second lead.

20. The system as claimed in claim 16 wherein the component includes a flip chip.

* * * * *